United States Patent [19]

Bhatia et al.

[11] Patent Number: 4,507,171

[45] Date of Patent: Mar. 26, 1985

[54] METHOD FOR CONTACTING A NARROW WIDTH PN JUNCTION REGION

[75] Inventors: Harsaran S. Bhatia; Satyapal S. Bhatia, both of Wappingers Falls; Jacob Riseman, Poughkeepsie; Emmanuel A. Valsamakis, Yorktown Heights, all of N.Y.

[73] Assignee: International Business Machines Corporation, Armonk, N.Y.

[21] Appl. No.: 405,844

[22] Filed: Aug. 6, 1982

[51] Int. Cl.³ .................. H01L 21/306; H01L 7/44; B44C 1/22; B05D 5/12
[52] U.S. Cl. .................. 156/643; 29/576 W; 29/580; 29/591; 148/187; 148/191; 156/648; 156/646; 156/653; 156/657; 156/662; 357/59; 357/65; 427/88
[58] Field of Search ............ 29/576 W, 580, 591; 148/1.5, 187, 191; 357/34, 35, 47–50, 59, 65; 427/85, 86, 88, 93; 156/643, 646, 648, 653, 657, 659.1, 662

[56] References Cited

U.S. PATENT DOCUMENTS

| | | | |
|---|---|---|---|
| 3,460,007 | 8/1969 | Scott, Jr. ............... | 317/235 |
| 3,484,313 | 12/1969 | Tauchi et al. .......... | 148/187 |
| 3,664,896 | 5/1972 | Duncan ................. | 148/187 |
| 3,978,515 | 8/1976 | Evans et al. ........... | 357/44 |
| 4,209,350 | 6/1980 | Ho et al. ............... | 148/188 |
| 4,236,294 | 12/1980 | Anantha et al. ....... | 29/578 |

Primary Examiner—William A. Powell
Attorney, Agent, or Firm—George O. Saile

[57] ABSTRACT

A method for making contact to a narrow width PN junction region in any desired semiconductor body is described. A substantially vertical conformal conductive layer is formed over the desired PN junction region. The body is heated at a suitable temperature to cause a dopant to diffuse from the vertical conductive layer into the semiconductor body to form the narrow width PN junction region. A substantially horizontal conductive layer makes contact to the substantially vertical layer so as to have the horizontal conductive layer in electrical contact to the PN junction region. Electrical contact can be made to the horizontal conductive layer at any convenient location. A lateral PNP transistor is one type of very small device that can be made using the method of the present invention.

15 Claims, 13 Drawing Figures

METHOD FOR CONTACTING A NARROW WIDTH PN JUNCTION REGION

TECHNICAL FIELD

The invention relates to methods performing highly dense integrated semiconductor devices and more particularly to forming such devices and making electrical contact thereto.

BACKGROUND ART

The complexity of integrated circuits have dramatically increased over the years. Smaller and smaller devices are required for the integrated circuit technology. A major problem in these very dense integrated circuits is the electrical contacts to the various elements and devices in the integrated circuit. The electrical contacted elements and devices of the integrated circuit must then be electrically connected through various levels of metallurgy to other devices within the integrated circuit.

It is known to use highly doped polycrystalline silicon as the source of a dopant for regions of monocrystalline silicon to form PN junctions therein. The polycrystalline silicon can either be removed or allowed to become part of the device as the electrical contact for the region formed by the out-diffusion from that polycrystalline silicon. The processes are taught, for example, by D. M. Duncan U.S. Pat. No. 3,978,515; J. H. Scott, Jr. U.S. Pat. No. 3,460,007; D. M. Duncan U.S. Pat. No. 3,664,896; S. Tauchi et al. U.S. Pat. No. 3,484,313 and I. T. Ho et al. U.S. Pat. No. 4,209,350. However, these patents are either silent on the method for the next level metallurgy to that electrical contact or have a second level metallurgy directly above the polycrystalline silicon electrical contact to the PN junction.

Other workers in the field have addressed the electrical contact, such as the U.S. Pat. No. 3,600,651, by providing lateral polycrystalline silicon contacts to a monocrystalline silicon active region. The polycrystalline silicon is then contacted at a more convenient location laterally away from the active region. N. G. Anantha et al. U.S. Pat. No. 4,236,294 also uses the technique of a polycrystalline silicon contact to a PN region and then a contact to the polycrystalline silicon layer at some convenient distance laterally away from that PN region.

SUMMARY OF THE PRESENT INVENTION

In accordance with the present invention, a method for making contact to a narrow width PN junction region in any desired semiconductor body is described. A substantially vertical conformal conductive layer is formed over the desired PN junction region. The body is heated at a suitable temperature to cause a dopant to diffuse from the vertical conductive layer into the semiconductor body to form the narrow width PN junction region. A substantially horizontal conductive layer makes contact to the substantially vertical layer so as to have the horizontal conductive layer in electrical contact to the PN junction region. Electrical contact can be made to the horizontal conductive layer at any convenient location.

A lateral PNP transistor is one type of very small device that can be made using the method of the present invention. The method involves providing a monocrystalline silicon body whose at least surface region is of N type conductivity. An insulating layer is formed on that surface region. A horizontal conductive layer is formed over the insulating layer. Regions are etched in the conductive layer and the insulating layer down to the silicon body to form substantially horizontal surfaces and substantially vertical surfaces on the layered structure. A conformal conductive layer is deposited over the substantially horizontal surfaces and substantially vertical surfaces. Anisotropic etching of the conformal conducting layer substantially removes the horizontal layer and provides a narrow dimension vertical conductive layer upon the substantially vertical surfaces and this layer is formed over the conductive layer and the vertical conformal conductive layer. The structure is heated at a suitable temperature to cause dopant of a P type conductivity to diffuse into the silicon body from the vertical conformal conductive layer to form the two-spaced narrow width P regions. The two-spaced P regions are to be connected as the emitter and collector of the lateral PNP device.

An integrated circuit structure formed in and on a semiconductor body which has surface regions isolated from other such regions by a pattern of dielectric isolation is also described. A narrow width PN junction region is formed within at least one of the surface regions having a width dimension substantially that of its electrical contact. A substantially vertical conformal conductive layer in electrical contact to the PN junction region forms a conductive link to a substantially horizontal conductive layer and separated from the surface regions by a first electrical insulating layer. A second electrical insulating layer is located over the horizontal conductive layer. An electrical contact to the horizontal conductive layer through an opening in the second electrical insulating layer effectively makes electrical contact to the narrow width PN junction region through the horizontal conductive layer and the vertical conductive layer. A lateral PNP bipolar device with this electrical contact structure can be made in an integrated circuit form.

DISCLOSURE OF THE INVENTION

Figure 1:
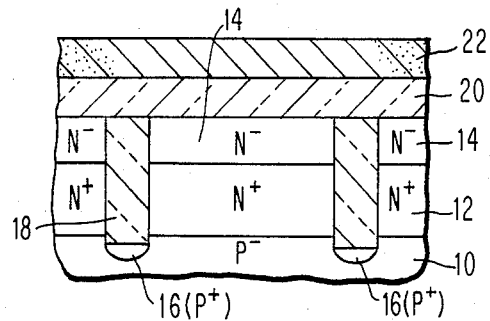
FIGS. 1 through 4 are a schematic, greatly enlarged cross-sectional illustration for the method of one embodiment of the invention for making a very small lateral PNP bipolar transistor.

Referring now more particularly to FIG. 1 there is illustrated an embodiment for forming lateral PNP bipolar transistors. The FIG. 1 illustrates one small and, greatly enlarged portion of the silicon body which will be used to form a very dense, high performance bipolar integrated circuit. However, it will be understood by workers in the art that semiconductor materials other than silicon can be used in conjunction with this process. A P— substrate of monocrystalline silicon 10 has a N+ subcollector region 12 therein. An epitaxial N— layer 14 is then grown on top of the substrate 10. These processes are standard processes in the formation of, for example, bipolar transistors. The substrate is typically a <100> crystallographic orientation silicon wafer having a resistance of about 10 to 20 ohm-cm. Subcollector diffusion is typically formed using arsenic having a surface concentration of about $1 \times 10^{20}$ atoms/cm$^3$. The epitaxial growth process to form layer 14 may be by conventional techniques, such as the use of silicon tetrachloride/hydrogen or silane mixtures at temperatures of between about 1000° C. to 1200° C. During the epitaxial growth the dopant in the N+ layer moves into the epitaxial layer to fully form the subcollector region 12 as illustrated in FIG. 1. The thickness of the epitaxial layer for highly dense integrated circuits is of the order of 3 micrometers or less. P+ regions 16 can also be formed in the substrate 10 in the designated areas under the recessed silicon dioxide isolating regions 18 which are to be formed. These P+ regions prevent surface inversion and current leakage when recessed dielectric isolation is used.

The next series of steps in this embodiment involve the formation of isolation regions of monocrystalline silicon from other regions of monocrystalline silicon. The isolation may be back-biased PN junctions, partial dielectric isolation or complete dielectric isolation. The dielectric materials used may be silicon dioxide, glass, etc. The preferred isolation for highly dense integrated circuits is dielectric isolation. FIG. 1 shows partial dielectric isolation with dielectric regions 18 together with the P+ region 16 isolating monocrystalline silicon regions of the silicon body from one another. There are many ways in the art to form dielectric isolation regions of this type. It is preferred to use the process described in the Magdo et al. patent application Ser. No. 150,609 filed June 7, 1971 or Peltzer U.S. Pat. No. 3,648,125. Alternately, the process described in the J. A. Bondur et al. U.S. Pat. No. 4,104,086 can be used. In that patent application and patents the processes for forming partial dielectric isolation for the regions 18, are described in detail.

A silicon dioxide or other suitable insulator layer 20 is formed over the principal surface of the silicon semiconductor body. The layer 20 may be typically about 300 nanometers and is preferably of silicon dioxide. The silicon dioxide may be formed either by a thermal oxidation process or chemical vapor deposition process. This layer 20 may be thermally grown in an oxygen or oxygen-water vapor ambient at a temperature of about 970° C. A second method for growing silicon dioxide involves the use of chemical vapor deposition process wherein silane, and an oxygen source, such as $N_2O$ at a temperature of about 450° C. or $SiH_2Cl_2$ and $N_2O$ is reacted at a temperature of about 800° C. under atmospheric or low pressure conditions. Alternate insulating layers or combinations thereof may be formed in place of the silicon dioxide.

A conductive layer 22 of P doped polycrystalline silicon is now deposited over the entire wafer by using a mixture of silane and diborane in a hydrogen atmosphere in a temperature range of between about 500° C. to 1,000° C. Alternatively, the polycrystalline silicon can be deposited and then doped by an ion implantation process with boron or similar P type dopants. The thickness of the polycrystalline silicon may be of the order of about 300 nanometers.

Figure 2:
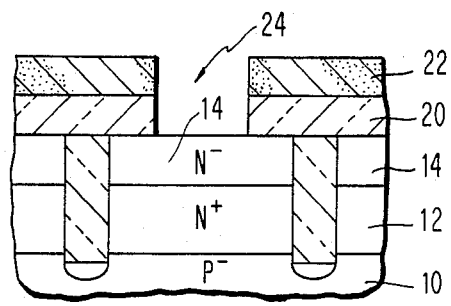

Standard lithography and etching techniques are utilized to make openings in the polycrystalline silicon layer 22 and silicon dioxide insulator layer 20 so as to produce substantially vertical sidewalls in the opening 24 shown in FIG. 2. This process of producing the substantially vertical sidewalls is accomplished by use of anisotropic reactive ion etching or plasma etching.

Figure 3:
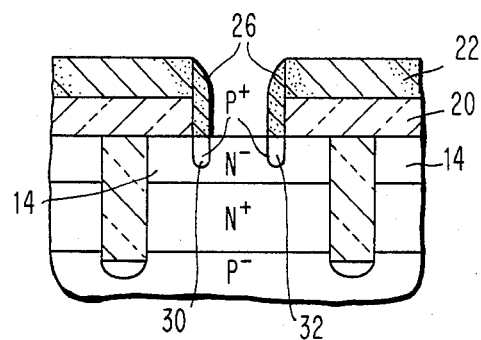

A conformal conductive layer 26 is formed over the substantially horizontal surfaces and substantially vertical surfaces of the FIG. 2 structure. This layer 26 is typically formed by chemical vapor deposition. This conformal conductor may be composed of polycrystalline silicon highly doped with an appropriate dopant such as P+ or N+. However, in the present method embodiment it is doped with P+ type impurities. A thickness of the conformal conductor layer 26 is chosen as the desired width of the desired PN region to be subsequently formed by outdiffusion from the conductive layer 26. The thickness is between about 100 to 1000 nanometers and preferably 400 nanometers. The resulting structure is placed into a suitable reactive ion etching ambient for the polycrystalline silicon. For example, the etching ambient may be $SF_6/Cl_2$. The reactive ion etching process substantially removes the horizontal portion of layer 26 and provides the narrow dimension vertical conductive region 26 as shown in FIG. 3.

An insulator layer 28 is now formed over the conductive layer 20 and the vertical conformal conductive layer 26. This layer may be formed by either thermal oxidation of the polycrystalline silicon layers and monocrystalline silicon body, by chemical vapor deposition, or a combination of thermal oxidation and chemical vapor deposition. Other insulators can be, of course, utilized. The thickness of the insulator layer 28 is, for example, 200 to 300 nanometers of chemical vapor deposited silicon dioxide. Another example would be about 50 nanometers of thermal silicon dioxide followed by an additional layer of about 200 to 300 nanometers of chemical vapor deposition of silicon dioxide.

The PN junction regions are formed by outdiffusion from the polycrystalline silicon vertical conformal conductor layer 26. This drive-in step involves the heating of the layered structure at a suitable temperature which is between about 800° C. to 1100° C. to cause the dopant from the vertical conductive layer to diffuse into the silicon body to the desired depth. In the FIG. 4 structure the P+ regions 30 and 32 are formed by this drive-in high temperature process. The regions 30 and 32 are respectively the emitter and collector regions of the lateral PNP bipolar transistor of the present process.

Lithography and etching techniques are utilized to form the contact openings to the horizontal conductor 22 to contact the emitter and collector regions for the lateral PNP transistor. A blanket deposit of suitable metal of, for example, a transition metal, aluminum, aluminum-copper, or the like over the surface of the structure. Other metal contacts can be made by deposition of platinum, palladium or the like and a reaction with the silicon to form a metal silicide contact. Lithography and etching is utilized to delineate the desired contact structure of 34 for the emitter contact and 36 for the collector contact to the PNP lateral transistor. The base contact to the N— base region 14 is not shown, but will be located at a convenient location somewhere off of the cross-sectional view of FIG. 4.

Figure 4:
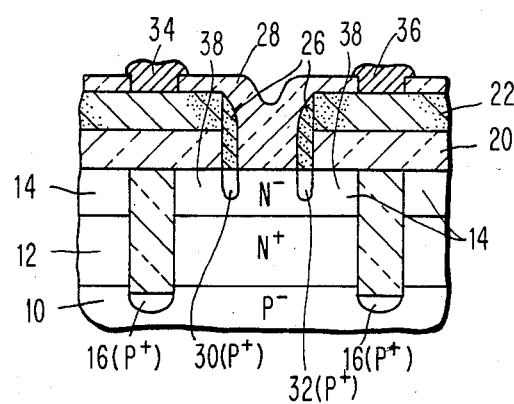

It is possible to improve the transistor gain of the lateral PNP transistor by implanting N+ type ions into the area 38 of FIG. 4 where the PN junction regions are to be located.

Figure 5:
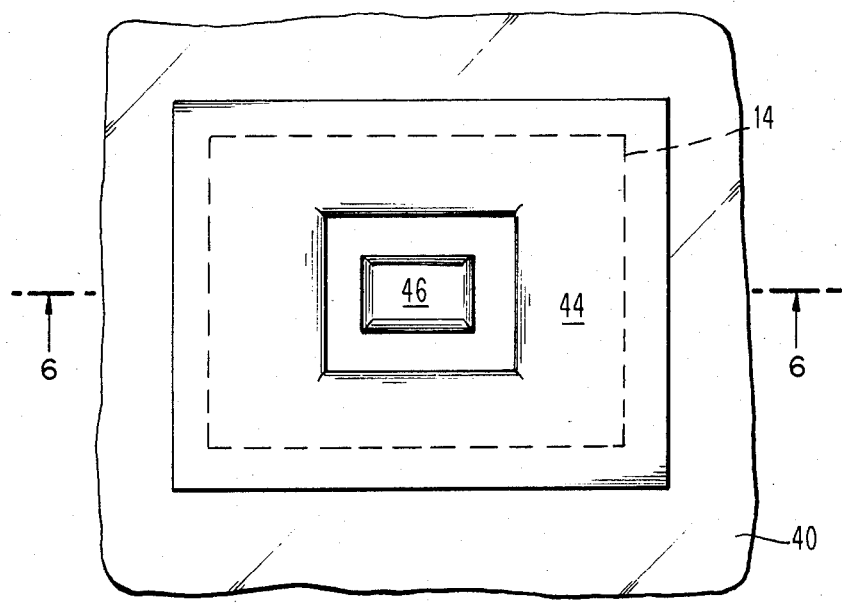
FIGS. 5 and 6 illustrate a fully enclosed lateral PNP bipolar transistor structure both in plan and cross-sectional views.
Figure 6:
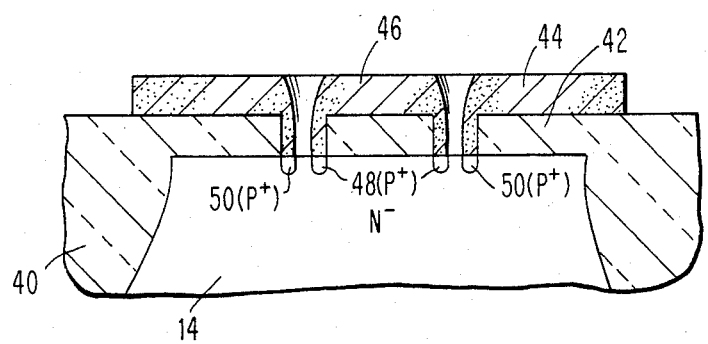

Referring now more particularly to FIG. 5 and 6 there is shown a layout for lateral PNP structure which can be built. The FIG. 5 plan view shows a fully enclosed dielectric isolated structure. A cross-section taken along 6:6 of FIG. 5 is shown in FIG. 6. The fully enclosed structure is isolated by isolation regions 40. Surface insulator 42 isolates the horizontal conductor 44 from the N− epitaxial layer 14. The etched pattern in the silicon dioxide insulator 42 and horizontal conductor 44 was designed to produce a fully enclosed region 46. The vertical conformal conductive layer is formed around that enclosed region 46 which results in a P+ junction under the outer edge of the central mesa in the silicon body under the vertical conductive layer 48. The other P+ contact is on the outer edge of the etched region to form P+ contact 50. Electrical contact can be then made to the P+ regions 48 and 50 as was described in relation to FIG. 4 in the previous embodiment so as to allow the electrically isolated contacts to the horizontal conductor through the vertical conformal conductor and to the regions 48 and 50.

Figure 9:
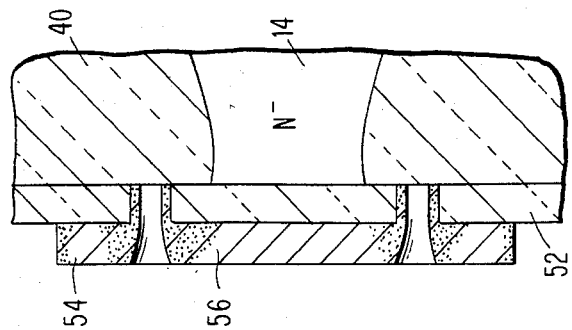
FIGS. 7 through 9 illustrate two-sided dielectrically enclosed lateral PNP bipolar structure both in plan and in cross-sectional views.
Figure 7:
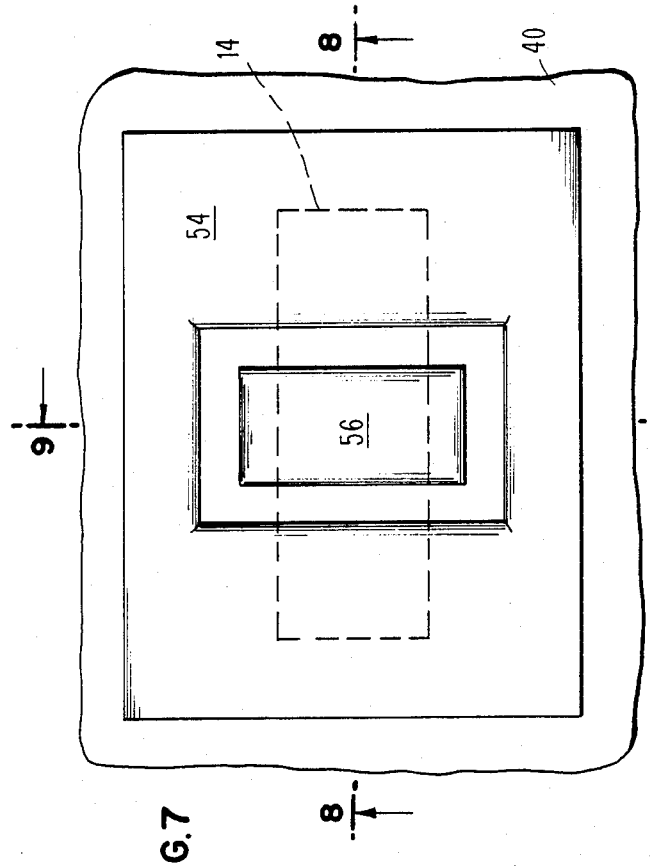
Figure 8:
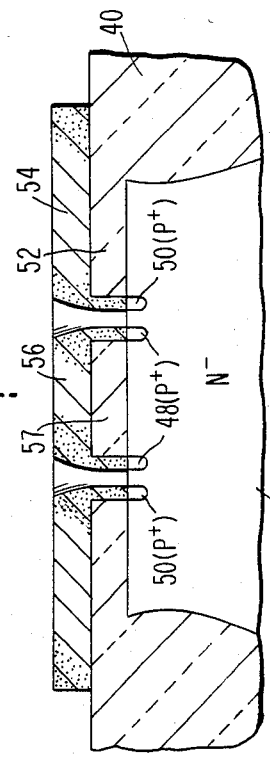

FIGS. 7, 8 and 9 illustrate the plan view and cross-sectional views taken along 8:8 and 9:9 of a two-sided enclosed lateral PNP structure. This is similar to the structure described in the FIGS. 5 and 6 embodiment wherein like numbers indicate like structures. The fully enclosed structure is isolated by isolation regions 40. The surface insulator 52 isolates the horizontal conductor 54 from the N− epitaxial layer 14 such that two opposite sides overlap 14 and the other two overlap isolation region 40. Similarly, the surface insulator 57 isolates horizontal conductor 56 from the N− epitaxial layer 14 with two opposite sides overlapping isolation regions 40 as shown in FIG. 9. The vertical conductive conformal layer formed around the enclosed region 56 results in P+ junctions 48 only in the regions where surface insulator 52 is not overlapping isolation region 40. The other P+ regions 50 are formed by the vertical conductive layer around horizontal conductive layer 54 in the regions where surface insulator 52 is overlapping N− epitaxial layer 14. Electrical contact to the P+ regions 48 and 50 can then be made similar to the embodiment of the previous example of FIG. 5.

The structure of FIG. 5 is fully enclosed with the emitter 46 injecting and the collector 44 collecting carriers on all four sides. The structure of FIG. 7 is also fully enclosed with the emitter 56 injecting and collector 54 collecting carriers on two sides only.

The structure of FIG. 5 has a higher current carrying capability for the same area over that of FIG. 7 and is best integrated with four NPN devices in the same isolation pocket. That of FIG. 7 is best integrated with two NPN devices and offers layout advantages.

Figure 10:
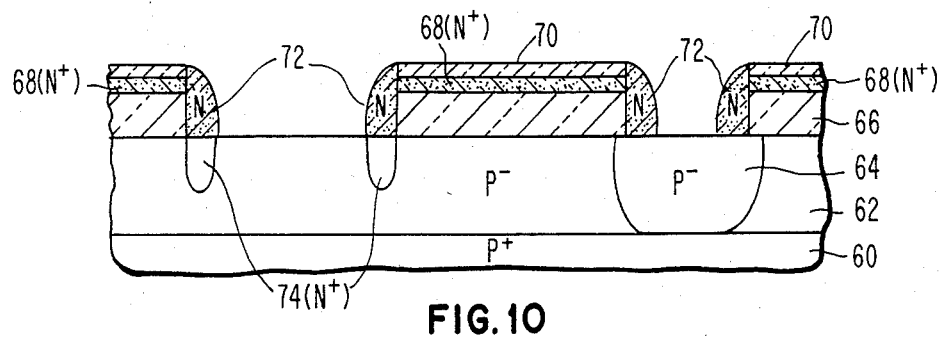
FIGS. 10 through 13 illustrate another method embodiment for making electrical contact to a narrow width PN junction region in a vertical PNP bipolar device.

Referring now more particularly to FIGS. 10 through 13, a vertical PNP bipolar transistor is illustrated. Referring now more particularly to FIGS. 10 through 13 where there is shown a process for forming a vertical PNP transistor. FIG. 10 is the first figure shown in this series of process steps and is somewhat similar to the processing stage of the FIG. 3 in the first process embodiment. FIG. 10 illustrates a subcollector 60 which has been formed upon a substrate which is not shown. The substrate can be of any desired conductivity but is typically N−. Also formed is the P− epitaxial layer 62 on the silicon semiconductor substrate. Within the epitaxial layer has been formed by either conventional ion implantation or diffusion processes a P+ reach-through region 64. The surface layers have insulating layer 66 which is typically silicon dioxide, polycrystalline silicon N+ layer 68 and a second insulating layer 70 over the polycrystalline silicon layer 68. N+ vertical conformal conductive layers 72 have been formed as was described in the first embodiment above to make contact between the horizontal layer 68 and the PN junction regions 74 as shown in the figure. The PN junction regions 74 have been made according to the same high temperature processes described in the first embodiment described above. The outdiffusion from the N vertical conductive layer 72 in the area of the P+ reach-through region 64 is not sufficient in a quantity of N type dopant to overcome the P+ conductivity of the region 64.

Figure 11:
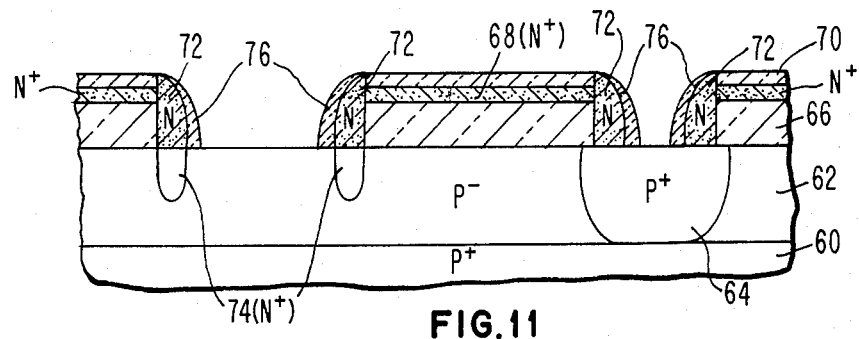

The FIG. 10 structure is subjected to thermal oxidation to form silicon dioxide layer 76 over the vertical conductive layers. Alternatively, a chemical vapor deposition of an insulator such as silicon dioxide or a combination of silicon dioxide with other insulators can be blanket deposited followed by anisotropic reactive ion etching to leave the insulation covering 76 as shown in FIG. 11.

Figure 12:
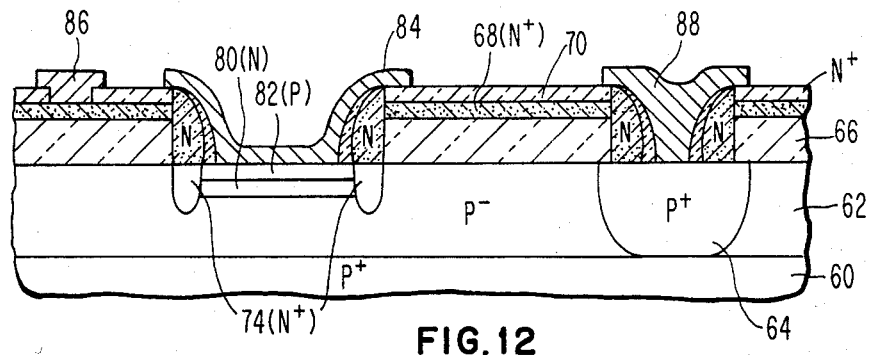
Figure 13:
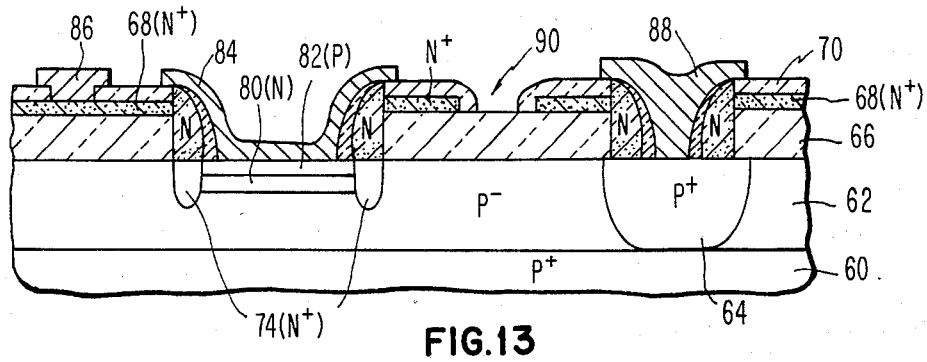

The N+ regions 74 will be connected as the extrinsic base regions. The intrinsic base region 80 and the emitter region 82 are formed by conventional ion implantation or diffusion techniques using the structure of FIG. 11 with usually a block-out mask to prevent the unwanted doping of the collector reach-through region 64. As was described in the case of the first embodiment a blanket metal layer of one or a combination of a variety of known contact metals is deposited over the principal surface of the structure. The metal is delineated by conventional lithography and etching techniques to form the emitter contact 84, base contact 86 and collector contact 88 as shown in FIG. 12. The N+ horizontal layer 68 has to be broken by etching between the base region and the collector reach-through region and then reoxidized as shown at 90 in FIG. 13.

To further improve the electrical conductivity of the horizontal conductive layer and vertical conformal conductive layer of the device embodiments, refractory metal silicide, e.g., $WSi_2$, $TaSi_2$, $PdSi_2$, $PtSi_2$ or the like, or the so-called polycide film that consists of a layer of metal silicide in combination with a layer or layers of polycrystalline silicon, can be used rather than the polycrystalline silicon layers described in the aforementioned embodiments. Metal silicide layer thickness, for example, would range from about 150 to 500 nanometers for the horizontal conductive layer and about 50 to 500 nanometers for the conformal conductor layer. The polycide thickness would range from about 200 to 400 nanometers polycrystalline silicon and 150 to 500 nanometers metal silicide for the horizontal conductive layer and about 50 to 200 nanometers polycrystalline silicon and about 50 to 300 nanometers metal silicide for the conformal conductive layer.

While the invention has been particularly shown and described with reference to the preferred embodiments thereof, it will be understood by those skilled in the art that the foregoing and other changes in form and details may be made without departing from the spirit and scope of the invention. For example, opposite conductivity types can be substituted for the illustrated conductivity types in all cases to form NPN bipolar transistors rather than PNP bipolar transistors described in the embodiments above. Also, the PN regions do not have to form a part of a bipolar transistor but can form a part of other types of devices useful in the integrated circuit or discrete device arts. The semiconductor devices can be incorporated into a wide range of integrated circuits having other types of devices, for example, the lateral PNP bipolar transistor is particularly useful in combination with a vertical NPN bipolar transistor in complementary bipolar circuitry. The lateral PNP process described in the first embodiment can be readily incorporated into a vertical NPN bipolar transistor process so as to form the useful complementary logic integrated circuit devices. The method and structure is of course, adaptable to other semiconductor materials and is not limited to monocrystalline silicon.

What is claimed is:

1. A method for making contact to a narrow width PN junction region comprising:
   providing a monocrystalline semiconductor body whose at least surface region is of a first conductivity;
   forming an insulating layer on said surface region;
   forming a conductive layer over said insulating layer;
   etching regions of said conductive layer and said insulating layer down to said silicon body to form substantially horizontal surfaces and substantially vertical surfaces on the layered structure;
   forming a conformal conductive layer over said substantially horizontal surfaces and said substantially vertical surfaces;
   etching said conformal conductive layer to substantially remove said horizontal layer and to provide a narrow dimensioned vertical conductive layer upon said substantially vertical surfaces and said silicon body;
   forming an insulator over said conductive layer and said vertical conformal conductive layer;
   heating said body and said layered structure at a suitable temperature to cause dopant of a second conductivity to diffuse into said body from said vertical conformal conductive layer to form said narrow width PN junction region; and
   forming an electrical contact to said conductive layer through said insulator which effectively makes electrical contact to said narrow width PN junction region through said conductive layer and said vertical conformal conductive layer.

2. The method of claim 1 wherein said first conductivity is N type said second conductivity is P type and said semiconductor body is silicon.

3. The method of claim 1 wherein said etching is by anisotropic reactive ion etching.

4. The method of claim 1 wherein said conductive layer and said conformal conductive layer are P+ type polycrystalline silicon.

5. The method of claim 1 wherein the thickness of said conformal conductive layer and resulting narrow dimensioned vertical conductive layer is between about 100 to 1000 nanometers.

6. The method of claim 1 wherein said heating said body is between about 800° to 1100° C.

7. The method of claim 1 wherein said insulating layer and said insulator are composed of silicon dioxide.

8. The method of claim 1 wherein said electrical contact to said conductive layer is composed of aluminum metallurgy.

9. The method of claim 2 wherein said PN junction is the emitter to a lateral PNP transistor.

10. A method for making contact to a narrow width PN junction regions of a lateral PNP transistor comprising:
    providing a monocrystalline silicon body whose at least surface region is of a N type conductivity;
    forming a insulating layer on said surface region;
    forming a conductive layer over said insulating layer;
    etching regions in said conductive layer and said insulating layer down to said silicon body to form substantially horizontal surfaces and substantially vertical surfaces on the layered structure;
    forming a conformal conductive layer over said substantially horizontal surfaces and said substantially vertical surfaces;
    etching said conformal conductive layer to substantially remove said horizontal layer and to provide a narrow dimensioned vertical conductive layer upon said substantially vertical surfaces and said silicon body;
    forming an insulator over said conductive layer and said vertical conformal conductive layer;
    heating said body and said layered structure at a suitable temperature to cause dopant of a P type conductivity to diffuse into said body from said vertical conformal conductive layer to form two-spaced said narrow width P junction regions;
    forming an electrical contact to said conductive layer through said insulator which effectively makes electrical contact to said narrow width PN junction regions through said conductive layer and said vertical conformal conductive layer; and
    said contact is made to said P junction regions designated as the emitter and as the collector of said lateral PNP transistor.

11. The method of claim 10 wherein the thickness of said conformal conductive layer and resulting narrow dimensioned vertical conductive layer is between about 100 to 1000 nanometers.

12. The method of claim 10 wherein said heating said body is between about 800° to 1100° C.

13. The method of claim 10 wherein said insulating layer and said insulator are composed of silicon dioxide.

14. The method of claim 10 wherein N+ ions are implanted into the area where said PN junction regions are located to improve transistor gain.

15. The method of claim 10 wherein said lateral PNP transistor is electrically isolated from like transistors and vertical NPN transistors by recessed dielectric isolation.

* * * * *